(12) United States Patent
Kim et al.

(10) Patent No.: US 8,658,479 B2
(45) Date of Patent: Feb. 25, 2014

(54) METHOD OF FORMING TRANSPARENT ELECTRODE AND FABRICATING ARRAY SUBSTRATE FOR LIQUID CRYSTAL DISPLAY DEVICE

(75) Inventors: Yong-Il Kim, Chungcheongnam-do (KR); Jeong-Oh Kim, Seoul (KR); Gi-Sang Hong, Gyeonggi-do (KR); Jung-Sun Beak, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 15 days.

(21) Appl. No.: 13/549,859

(22) Filed: Jul. 16, 2012

(65) Prior Publication Data
US 2013/0029446 A1 Jan. 31, 2013

(30) Foreign Application Priority Data
Jul. 27, 2011 (KR) .................. 10-2011-0074423

(51) Int. Cl.
*H01L 21/00* (2006.01)
(52) U.S. Cl.
USPC .................................. 438/149

(58) Field of Classification Search
USPC .................................. 438/149
See application file for complete search history.

(56) References Cited

U.S. PATENT DOCUMENTS

2012/0086881 A1* 4/2012 Kim et al. ............ 349/46

* cited by examiner

*Primary Examiner* — Telly Green
(74) *Attorney, Agent, or Firm* — Morgan, Lewis & Bockius LLP

(57) ABSTRACT

A method of forming a transparent electrode includes forming a first transparent conductive material layer on a base; performing a plasma process on the first transparent conductive material layer such that the upper portion of the first transparent conductive material layer is changed into semi-transparent; forming a second transparent conductive material layer on the first transparent conductive material layer; patterning the second transparent conductive material layer and the first transparent conductive material layer; and annealing the patterned second transparent conductive material layer and the patterned first transparent conductive material layer such that the upper portion of the first transparent conductive material layer is changed into transparent.

18 Claims, 8 Drawing Sheets

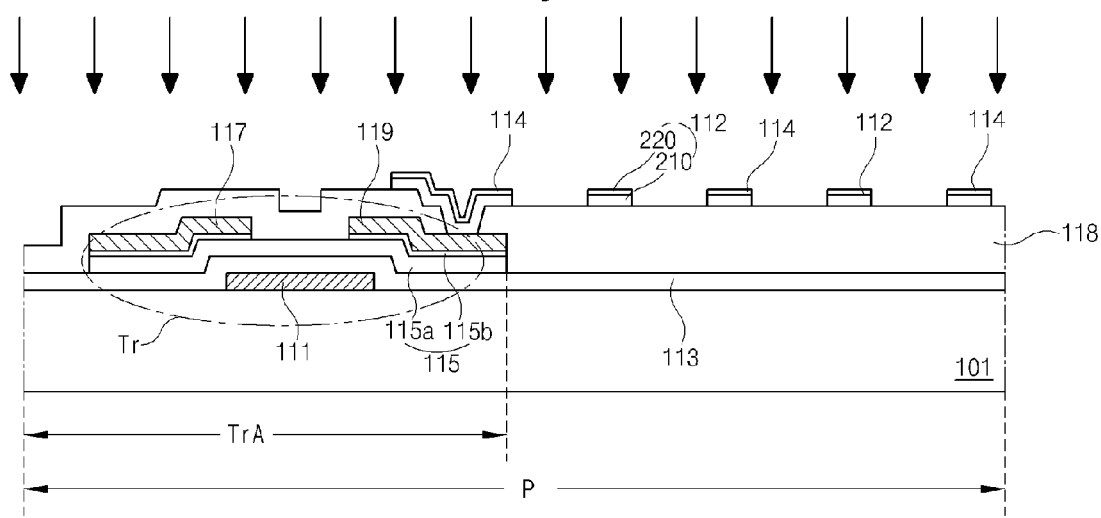

METHOD OF FORMING TRANSPARENT ELECTRODE AND FABRICATING ARRAY SUBSTRATE FOR LIQUID CRYSTAL DISPLAY DEVICE

The present application claims the benefit of Korean Patent Application No. 10-2011-0074423 filed in Korea on Jul. 27, 2011, which is hereby incorporated by reference.

BACKGROUND OF THE INVENTION

1. Field of the Invention

The present invention relates to a liquid crystal display (LCD) device and more particularly to a method of forming transparent electrode and fabricating an array substrate for an LCD device being capable of preventing a problem in a patterning process resulted from reflection of light by a chuck.

2. Discussion of the Related Art

The LCD device, which uses an optical anisotropy and a polarization property to display an image, is widely used for notebook computers, monitors, TV, and so on, because of their high contrast ratio and characteristics adequate to display moving images.

The LCD device includes a liquid crystal panel having a first substrate, a second substrate and a liquid crystal layer. The first and second substrates face each other, and the liquid crystal layer is interposed therebetween. An arrangement of the liquid crystal molecules in the liquid crystal layer is changed by an electric field induced in the liquid crystal panel to control light transmissivity.

In twisted nematic (NT) mode LCD device, the liquid crystal molecules are driven by a vertical electric field between the pixel electrode and the common electrode, has excellent properties of transmittance and aperture ratio. Unfortunately, since the LCD device uses the vertical electric field, the device has a bad viewing angle.

An in-plane switching (IPS) mode LCD device may be used to resolve the above-mentioned limitations. FIG. 1 is a schematic cross-sectional view of a liquid crystal panel for the related art IPS mode LCD device. Referring to FIG. 1, the liquid crystal panel includes first and second substrates 1 and 3 facing each other and a liquid crystal layer 5 therebetween.

On the first substrate 1, both of a pixel electrode 21 and a common electrode 25 are formed. The liquid crystal molecules of the liquid crystal layer 5 are driven by a horizontal electric field L generated between the pixel and common electrodes 21 and 25. Since the liquid crystal molecules are driven by the horizontal electric field L between the pixel and common electrodes 21 and 25 on the first substrate 1, the IPS mode LCD device has a wide viewing angle.

The LCD devices are fabricated using a photolithography process including a step of forming a photosensitive material layer, a step of exposing, a step of developing, and a step of etching. The photolithography process may be referred to as a mask process. In the exposing step, an exposing mask having the portions for transmitting light and the other portions for blocking light and an exposing apparatus irradiating the light are used.

In the photolithograph process, an objective material layer is formed on a substrate, and a photoresist (PR) layer as the photosensitive material layer is formed on the objective material layer. The substrate, on which the objective material layer and the PR layer are formed, is transferred into the exposing apparatus. In the exposing apparatus, the exposing mask is disposed over the substrate and aligned. Then, the PR layer is exposed to the light through the exposing mask. In this case, to prevent a mis-align problem between the substrate and the mask during the exposing step, the substrate is positioned on and fixed by a chuck.

On the other hand, some problems are caused in the photolithography process for a transparent conductive material. For example, when the transparent conductive material is patterned by the photolithography process, there is a deviation in a critical dimension. Namely, a width of the pixel electrode obtained by the photolithography process is smaller than a desired width of the pixel electrode such that a width of the pixel electrodes or the common electrodes is not uniform. An electric field between the pixel and common electrodes is to be different such that a problem, which looks like a stain on the images, is generated.

SUMMARY OF THE INVENTION

Accordingly, the present invention is directed to a method of forming a transparent electrode and fabricating an array substrate for an LCD device that substantially obviate one or more of the problems due to limitations and disadvantages of the related art.

An object of the present invention is to provide a method of forming a transparent electrode having a uniform size.

Another object of the present invention is to provide a method of fabricating an array substrate having uniform size and improved aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method of forming a transparent electrode includes forming a first transparent conductive material layer on a base; performing a plasma process on the first transparent conductive material layer such that the upper portion of the first transparent conductive material layer is changed into semitransparent; forming a second transparent conductive material layer on the first transparent conductive material layer; patterning the second transparent conductive material layer and the first transparent conductive material layer; and annealing the patterned second transparent conductive material layer and the patterned first transparent conductive material layer such that the upper portion of the first transparent conductive material layer is changed into transparent.

In another aspect, a method of fabricating an array substrate for a liquid crystal display device includes forming a gate line on a substrate; forming a data line on the substrate, the data line crossing the gate line to define a pixel region; forming a thin film transistor connected to the gate line and data line in the pixel region; forming a first transparent conductive material layer on the substrate on which the gate line, the data line and the thin film transistor are formed; performing a plasma process to the first transparent conductive material layer with hydrogen gas such that the upper portion of the first transparent conductive material layer is changed into semitransparent; forming a second transparent conductive material layer on the first transparent conductive material layer; patterning the second transparent conductive material layer and the first transparent conductive material layer to form a pixel electrode connected to the thin film transistor in the pixel region; and annealing the pixel electrode such that the upper portion is changed into transparent.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 3A to 3L are cross-sectional views illustrating a method of fabricating an array substrate for an IPS mode LCD device according to the present invention.

DETAILED DESCRIPTION OF THE PREFERRED EMBODIMENTS

Reference will now be made in detail to the preferred embodiments, examples of which are illustrated in the accompanying drawings.

Figure 1:
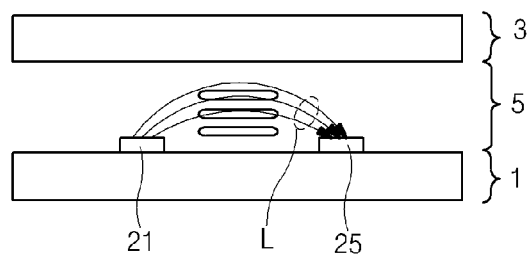
FIG. 1 is a cross-sectional view of the related art IPS mode LCD device.
Figure 2:
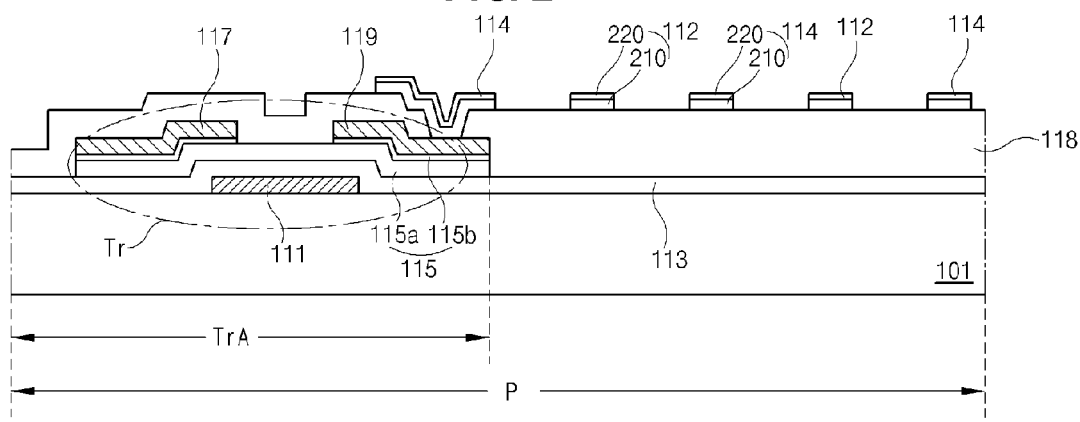
FIG. 2 is a cross-sectional view of an array substrate for an LCD device according to the present invention.

FIG. 2 is a cross-sectional view of an array substrate for an LCD device according to the present invention. A patterning method and a fabricating method of the present invention can be used for any device including a transparent conductive material pattern such as a pixel electrode and a common electrode. Hereinafter, the patterning method and the fabricating method of the present invention are explained with the array substrate for the IPS mode LCD device.

Referring to FIG. 2, an array substrate for an IPS mode LCD device includes a substrate 101, a gate line (not shown), a data line (not shown), a common line (not shown), a thin film transistor (TFT) Tr, a common electrode 112 and a pixel electrode 114.

The common line is parallel to and spaced apart from the gate line. The data line crosses the gate line to define a pixel region P. The TFT Tr is positioned at a crossing portion of the gate and data lines. A region where the TFT Tr is formed is defined as a switching region TrA. The TFT Tr is connected to the gate line and the data line and includes a gate electrode 111, a semiconductor layer 115, a source electrode 117 and a drain electrode 119. The gate electrode 111 is connected to the gate line, and a gate insulating layer 113 is formed on the gate electrode 111. The semiconductor layer 115 is formed on the gate insulating layer 113 and corresponds to the gate electrode 111. The semiconductor layer 115 includes an active layer 115a of intrinsic amorphous silicon and an ohmic contact layer 115b of impurity-doped amorphous silicon. The source electrode 117 is connected to the data line. The source and drain electrodes 117 and 119 are formed on the semiconductor layer 115 and spaced apart from each other.

A passivation layer 118 having a drain contact hole exposing the drain electrode 119 is formed on the TFT Tr.

The common electrode 112 and the pixel electrode 114 are formed on the passivation layer 118. The common electrode 112 is connected to the common line, and the pixel electrode 114 is connected to the drain electrode 119 of the TFT Tr through the drain contact hole. The common electrode 112 and pixel electrode 114 are alternately arranged with each other such that a horizontal electric field is generated therebetween. Since the liquid crystal molecules of the liquid crystal layer for the IPS mode LCD device are driven by the horizontal electric field between the common and pixel 112 and 114 on the substrate 101, the IPS mode LCD device has a wide viewing angle.

To improve an aperture ratio, at least one of the common electrode 112 and the pixel electrode 114 is formed of a transparent conductive material. FIG. 2 shows both the common electrode 112 and pixel electrode 114 being formed of the transparent conductive material. Particularly, the at least one of the common electrode 112 and the pixel electrode 114 includes a double-layered structure.

After a lower transparent conductive material layer is formed, a plasma process is performed on the lower transparent conductive material layer with hydrogen ($H_2$) gas such that the lower transparent conductive material layer looses a transparent property. An upper transparent conductive material layer is formed on the lower transparent conductive material layer which has been treated by the plasma process, and the upper transparent conductive material layer and the lower transparent conductive material layer are patterned to form the common electrode 112 and the pixel electrode 114. Then, the lower transparent conductive material layer which has been treated by the plasma process is annealed to regain the transparent property.

In the related art patterning process for a transparent conductive layer, some problems such as a critical dimension deviation is generated. In the exposing step of the photolithography process, the light for exposing the photosensitive material layer is reflected on the chuck such that an undesired portion of the photosensitive material layer is also exposed. Accordingly, a transparent conductive material pattern for a pixel electrode or a common electrode, which has an undesired size, is obtained.

However, in the present invention, although the common electrode 112 and the pixel electrode 114 are formed of a transparent conductive material, the above problem is eliminated because the lower transparent conductive material layer looses the transparent property before the photolithography process and regains the transparent property after the photolithography process. Namely, since the lower transparent conductive material layer looses the transparent property by the plasma process, the light for exposing the photosensitive material layer, e.g., the PR layer, is not reflected on the chuck, and hence an undesired portion of the photosensitive material layer is not exposed.

In addition, the lower transparent material layer has an embossing top surface due to the plasma process, and hence the top surface of the transparent material layer is easily damaged by an outer impact. Namely, damage such as scratch is easily generated on the top surface of the lower transparent conductive material layer after the plasma process. However, in the present invention, the above problem is prevented by forming the upper transparent conductive material layer on the lower transparent conductive material layer which has been treated by the plasma process, after the plasma process and before other processes.

The method of fabricating an array substrate is explained in more detail with reference to FIGS. 3A to 3L.

FIGS. 3A to 3L are cross-sectional views illustrating a method of fabricating an array substrate for an IPS mode LCD device according to the present invention. For convenience of explanation, the switching region TrA where the TFT is formed is defined in the pixel region P.

Figure 3A:
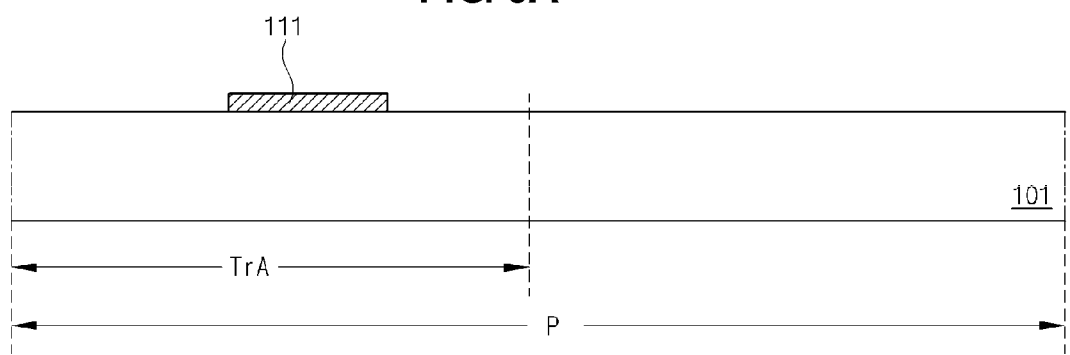

As shown in FIG. 3A, a first metal layer (not shown) is formed on a base, e.g. on a substrate 101, by depositing a low resistance metallic material such as molybdenum (Mo), aluminum (Al), Al alloy, copper (Cu) and Cu alloy. The first metal layer is patterned by a first mask process, which includes a step of forming a PR layer on the first metal layer, a step of exposing the PR layer using an exposing mask, a step of developing the exposed PR layer to form a PR pattern, a step of etching the first metal layer using the PR pattern as an etching mask and a step of stripping the PR pattern to form a gate electrode 111 in the switching region, a gate line (not shown) and a common line (not shown).

FIG. 3A shows the gate electrode 111 of a single layer. Alternatively, at least two layers of low resistance metallic materials maybe deposited and then patterned to form the gate electrode 111 of at least two layered structure.

Figure 3B:
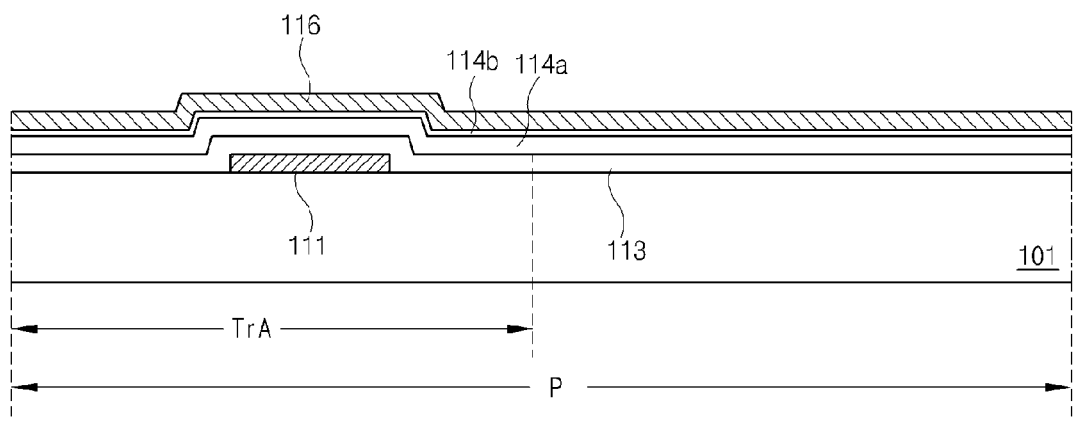

Next, as shown in FIG. 3B, a gate insulating layer 113 is formed on the substrate 101 on which the gate electrode 111, the gate line (not shown) and the common line (not shown) have been formed by depositing an inorganic insulating material such as silicon oxide and silicon nitride.

An intrinsic amorphous silicon layer 114a and an impurity-doped amorphous silicon layer 114b are sequentially formed on the gate insulating layer 113 by depositing intrinsic amorphous silicon and impurity-doped amorphous silicon. A second metal layer 116 is further formed on the impurity-doped amorphous silicon layer 114b by depositing a low resistance metallic material such as Cu, Cu ally, Al, Al ally or Mo.

Figure 3C:
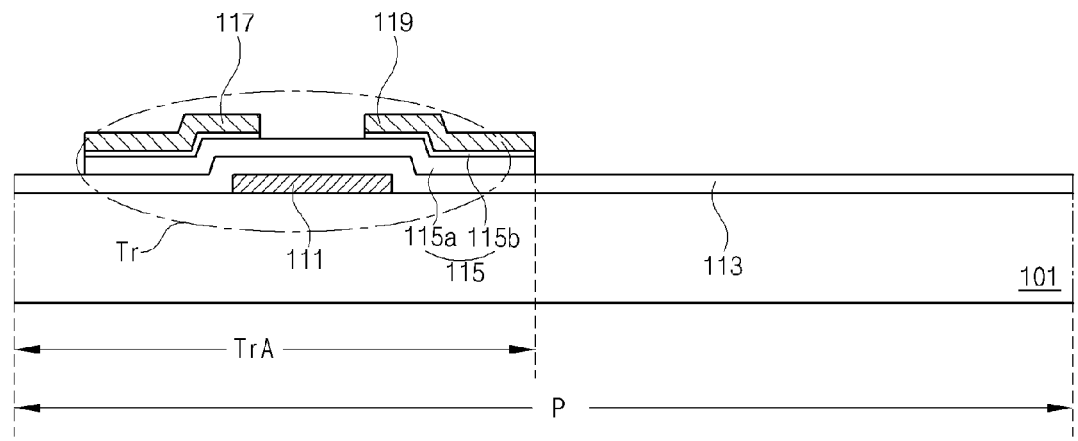

Next, as shown in FIG. 3C, a second mask process is performed on the second metal layer 116 (of FIG. 3B), the impurity-doped amorphous silicon layer 114b (of FIG. 3B) and the intrinsic amorphous silicon layer 114a (of FIG. 3B) to form the source electrode 117, the drain electrode 119, the data line (not shown), the ohmic contact layer 115b and the active layer 115a. As mentioned above, the data line crosses the gate line to define the pixel region P. A portion of the ohmic contact layer 115b which corresponds to the gate electrode 111 is removed using the source electrode 117 and the drain electrode 119 as an etching mask to expose the active layer 115a which is above the gate electrode 111.

The second mask process shown in FIGS. 3B and 3C may be referred to as a halftone mask process. Alternatively, the semiconductor layer, the source electrode and the drain electrode may be formed by different mask processes.

The gate electrode 111, the gate insulating layer 113, the semiconductor layer 115 including the active layer 115a and the ohmic contact layer 115b, the source electrode 117 and the drain electrode 119 constitute the TFT Tr.

Figure 3D:
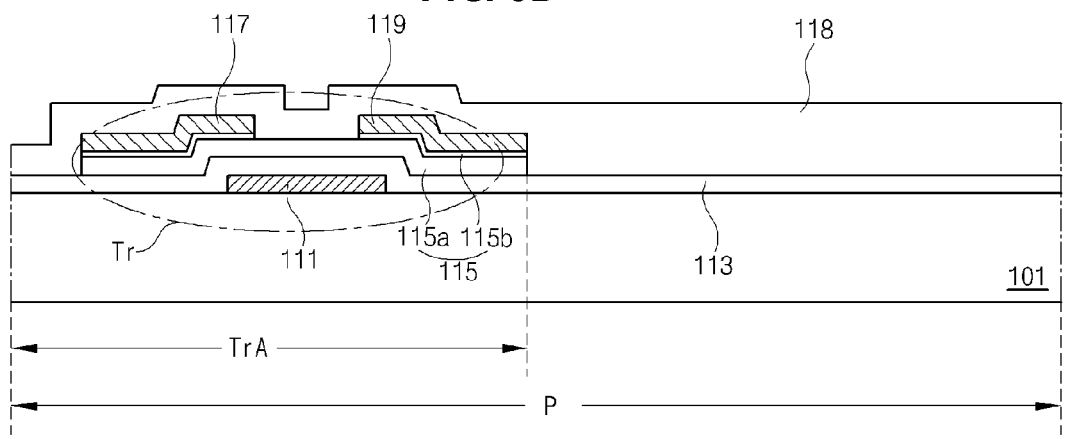

Next, as shown in FIG. 3D, a passivation layer 118 is formed on the substrate 111 on which the TFT Tr is formed by depositing an inorganic insulating material, e.g., silicon oxide or silicon nitride, or coating an organic insulating material, e.g., benzocyclobutene (BCB) or photo-acryl.

Figure 3E:
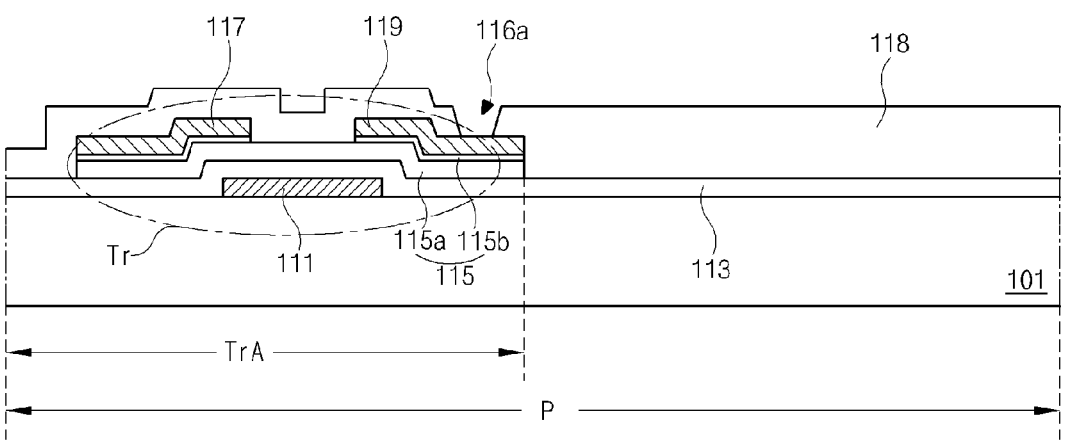

Next, as shown in FIG. 3E, the passivation layer 118 is patterned by a third mask process to form a drain contact hole 116a exposing the drain electrode 119. At the same time, the passivation layer 118 and the gate insulating layer 113 under the passivation layer 118 in the pixel region other than the switching region are also patterned to form a common line contact hole (not shown) exposing the common line.

Figure 3F:
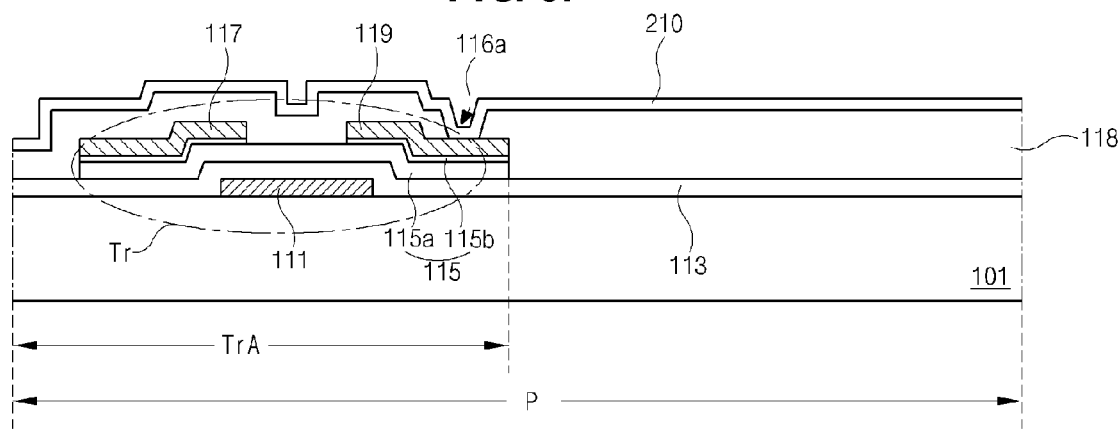

Next, as shown in FIG. 3F, a first transparent conductive material layer 210 is formed on the passivation layer 118 by depositing a first transparent conductive material. The first transparent conductive material is a material which includes indium and oxygen. For example, the first transparent conductive material may be one of indium-tin-oxide (ITO), indium-zinc-oxide (IZO), indium-gallium-zinc-oxide (IGZO) and indium-tin-zinc-oxide (ITZO).

Figure 3G:
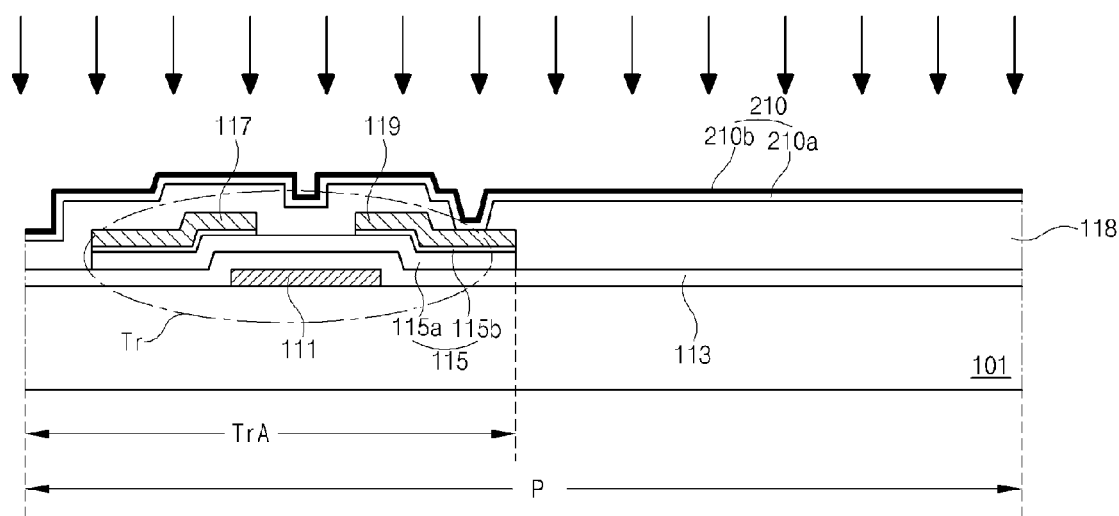

Next, as shown in FIG. 3G, the substrate 101, on which the first transparent conductive material layer 210 (of FIG. 3F) is formed, is positioned in a chamber (not shown) in which a plasma process can be performed. A plasma process is performed on the first transparent conductive material 210 with hydrogen ($H_2$) gas in the chamber.

In this instance, the plasma process is performed in the chamber having the degree of a vacuum of about 80 to 120 mTorr with a power of about 800 to 1000 W being supplied to the chamber and a hydrogen gas of about 80 to 100 being flown into the chamber at the rate of standard cubic centimeter per minute (sccm) for about 40 to 100 seconds.

When the first transparent conductive material layer 210 is subjected to the above mentioned plasma process, the oxygen at interface of the first transparent conductive material layer 210 is replace by the hydrogen. Namely, there is a reduction reaction. By this reduction reaction, the indium at the interface of the first transparent conductive material layer 210 regains a black color such that an upper portion of the first transparent conductive material layer 210 has a semitransparent property. Namely, the upper portion of the first transparent conductive material layer 210 looses the transparent property. As a result, the first transparent conductive material layer 210 becomes a layer including a lower transparent portion 210a and an upper semitransparent portion 210b.

Generally, the first transparent conductive material layer 210 has transmittance of about 92 to 95%. However, after the plasma process, the first transparent conductive material layer 210 including the upper semitransparent portion 210b and the lower transparent portion 210a has transmittance of about 50 to 70%.

Figure 3H:
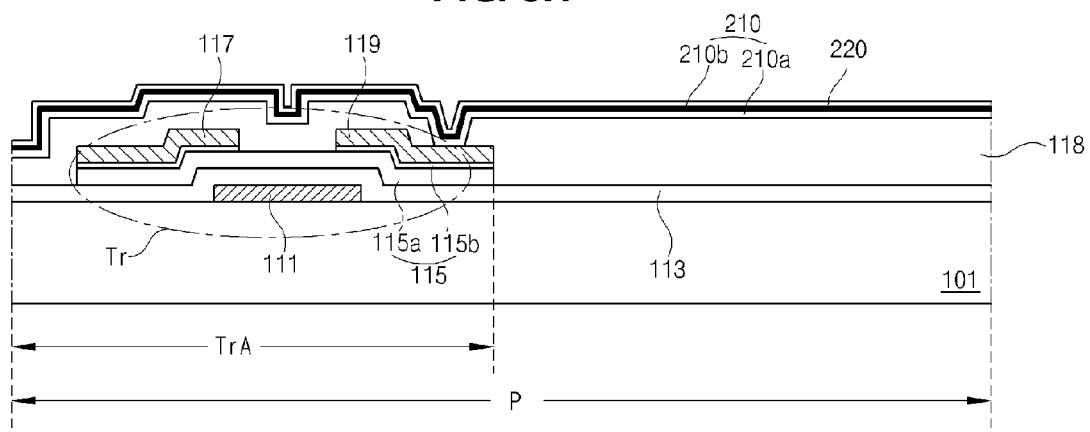

Next, as shown in FIG. 3H, a second transparent conductive material layer 220 is formed on the first transparent conductive material layer 210 which subjected to the plasma process by depositing a second transparent conductive material. For example, the second transparent conductive material may be one of ITO, IZO, IGZO and ITZO.

By the plasma process, the upper semitransparent portion 210b of the first transparent conductive material layer 210 has an embossing top surface which is easily damaged by an outer impact. Namely, damage such as scratch is easily generated on the top surface of the upper semitransparent portion 210b. However, by forming the second transparent conductive material layer 220, the top surface of the upper semitransparent portion 210b is protected from the outer impact. In addition, the second transparent conductive material layer 220 protects the top surface of the upper semitransparent portion 210b from damages during a mask process.

Figure 3I:
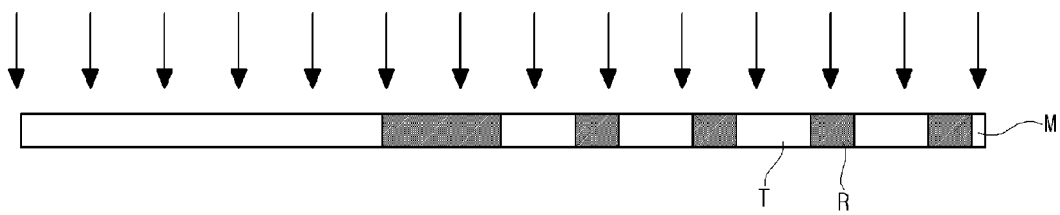
Figure 3I:
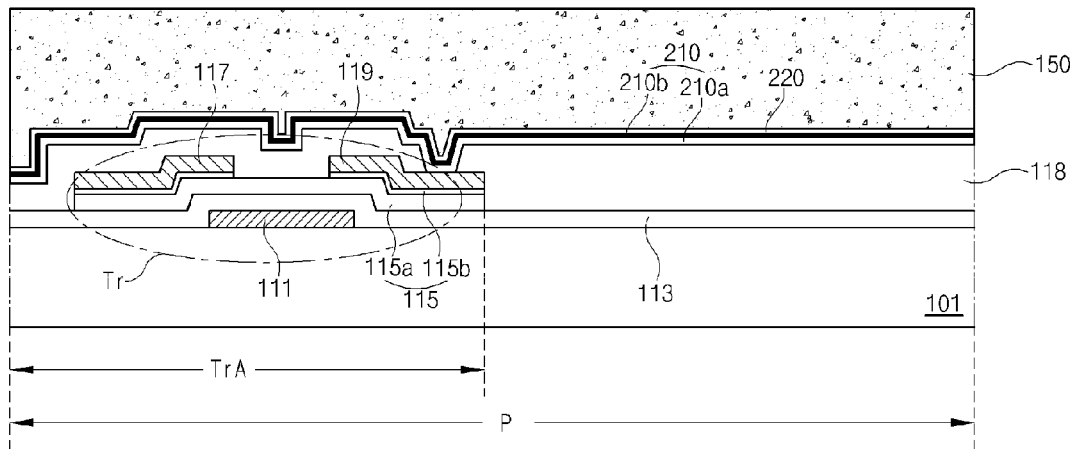

Next, as shown in FIG. 3I, a PR layer 150 is formed on the second transparent conductive material layer 220 by coating a PR material, and an exposing mask which includes blocking portions R and transmitting portions T which alternate with the blocking portions R is disposed over the PR layer 150, the blocking portions R correspond to the regions of the substrate where a common electrode and a pixel electrode are to be formed.

The PR layer 150 is exposed to light through the exposing mask. In this instance, to prevent a mis-align between the exposing mask and the substrate 101, the substrate 101 is supported and fixed by a chuck (not shown). When the light is irradiated to the PR layer 150 through the exposing mask M to react with the PR material. The light is irradiated on the second transparent conductive layer 220 and the first transparent conductive material layer 210 which is subjected to the plasma process. However, due to the upper semitransparent portion 210b of the first transparent conductive material layer 210, only about 50 to 70% of the light is transmitted through the first transparent conductive material layer 210. Accordingly, with compared to the transparent layer having about 92 to 95% transmittance, a the amount of light reflected by the chuck is reduced in the present invention.

In addition, the light reflected by the chuck passes through the upper semitransparent portion 210b of the first transparent conductive material layer 210 such that the amount of light irradiated to the PR layer 150 after reflection by the chuck is reduced by about 40% with respect to the transparent conductive layer. Moreover, the amount of light reflected by the chuck and irradiated to the PR layer 150 is further reduced due to the second transparent conductive layer 220. The amount of light does not affect on the PR layer 150 such that a problem of exposing an undesired portion of the PR layer 150 is prevented.

Namely, since the first transparent conductive material layer 210 has a lowered transmittance after being subjected to the plasma process, the amount of light reflected by the chuck and irradiated to the PR layer 150 is reduced and does not affect on the PR layer 150.

Figure 3J:
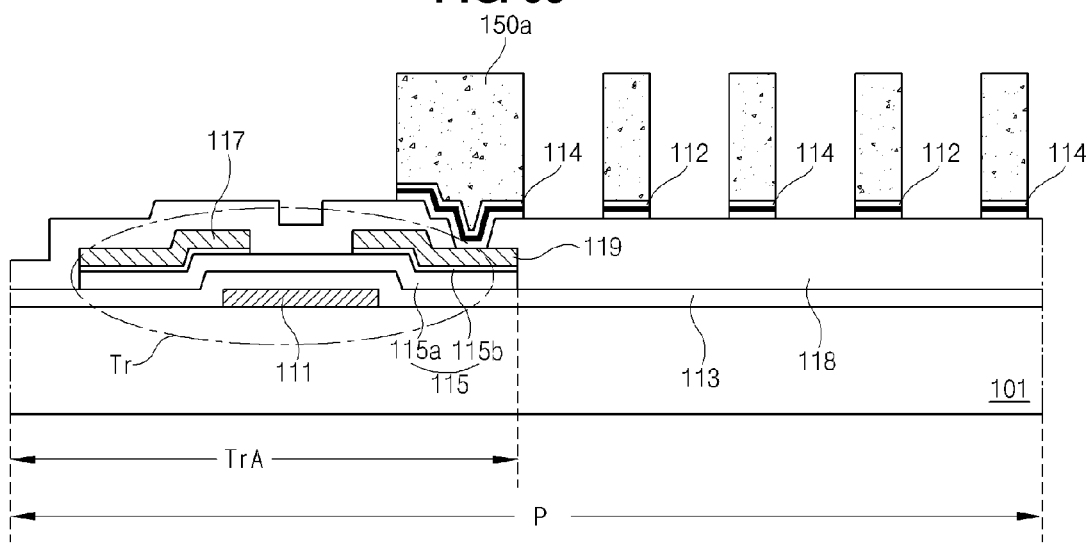

Accordingly, when the exposed PR layer 150 is developed, only the portions of the PR layer 150 corresponding to the transmitting portions T of the exposing mask M are developed and then removed to form PR patterns 150a, as shown in FIG. 3J.

Then, the second transparent conductive material layer 220 (of FIG. 3I) and the first transparent conductive material layer 210 (of FIG. 3I) are etched using the PR pattern 150a as an etching mask to form the common electrode 112 and the pixel electrode 114 under the PR pattern 150a. The pixel electrode 114 is connected to the drain electrode 119 through the drain contact hole 116a (of FIG. 3E), and the common electrode 112 is connected to the common line through the common line contact hole.

Figure 3K:
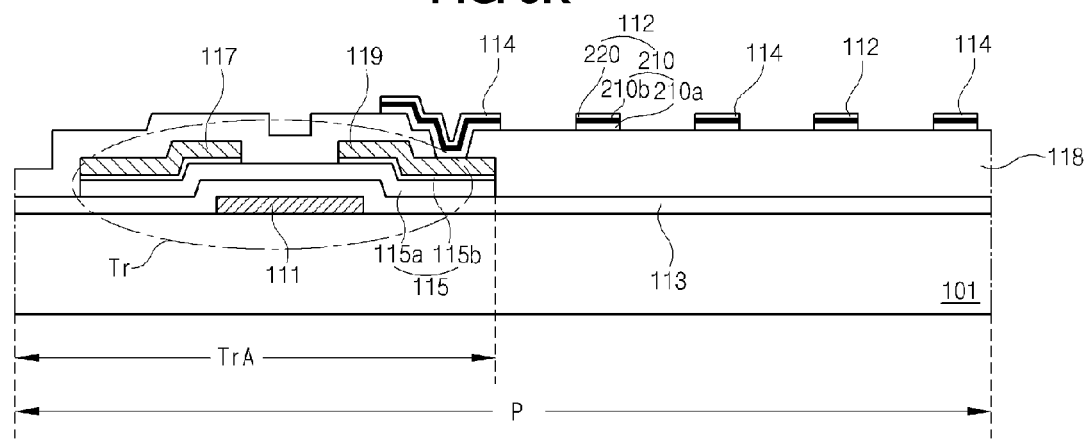

Next, as shown in FIG. 3K, the PR pattern 150a (of FIG. 3J) for the common electrode 112 and the pixel electrode 114 is removed by a stripping process. As mentioned above, the upper semitransparent portion 210b is very weak to an outer impact, an etchant of an etching process and a stripping solution of the stripping process. However, since the second transparent conductive material layer 220 is formed on the first transparent conductive material layer 210 and covers the upper semitransparent portion 210b of the first transparent conductive material layer 210, the upper semitransparent portion 210b is protected from the stripping solution or the etchant. Namely, since the upper semitransparent portion 210b has a low chemical resistance property, there are damages on the upper semitransparent portion by the etchant or the stripping solution. As a result, the upper semitransparent portion is over-etched and has deviation in a critical dimension. However, the above-mentioned problem is prevented due to the second transparent conductive material layer 220 formed on the upper semitransparent portion 210b.

Next, as shown in FIG. 3L, the substrate 101, on which the common electrode 112 and the pixel electrode 114 are formed, is disposed in a heating apparatus (not shown) such as an oven, and an annealing process is performed on the substrate 101 under a temperature of about 200 to 300° C. for 30 to 300 minutes. The annealing process may be performed at an atmosphere condition.

By the above-mentioned annealing process, heat and oxygen are provided into the common electrode 112 and the pixel electrode 114 such that the hydrogen in the upper semitransparent portion 210b (of FIG. 3K) of the first transparent conductive material layer 210 (of FIG. 3K) is replaced by the oxygen. Namely, an oxidation reaction is generated in the upper semitransparent portion 210b of the first transparent conductive material layer 210 by the annealing process such that the upper semitransparent portion 210b of the first transparent conductive material layer 210 regains the transparent property. As a result, each of the common electrode 112 and the pixel electrode 114 has a double-layered structure of the first transparent conductive material layer 210 and the second transparent conductive material layer 220.

In the present invention, although each of the common electrode 112 and the pixel electrode 114 is formed of a transparent conductive material layer, the problem in the related art by the light reflection by the chuck is prevented. In addition, the array substrate has substantially the same aperture ratio as the related art array substrate.

In addition, since the second transparent conductive material layer 220 covers the upper semitransparent portion 210b of the first transparent conductive material layer 210, the damage on the upper semitransparent portion 210b in the etching process and the stripping process are prevented.

Moreover, although a sheet resistance of the first transparent conductive layer 210 is increased by the plasma process, the sheet resistance is decreased by the annealing process. Namely, there is no increase of the sheet resistance.

Furthermore, the upper semitransparent portion 210b regains the transparent property by the annealing process, the array substrate has the substantially the same brightness as the related art array substrate.

Figure 4:
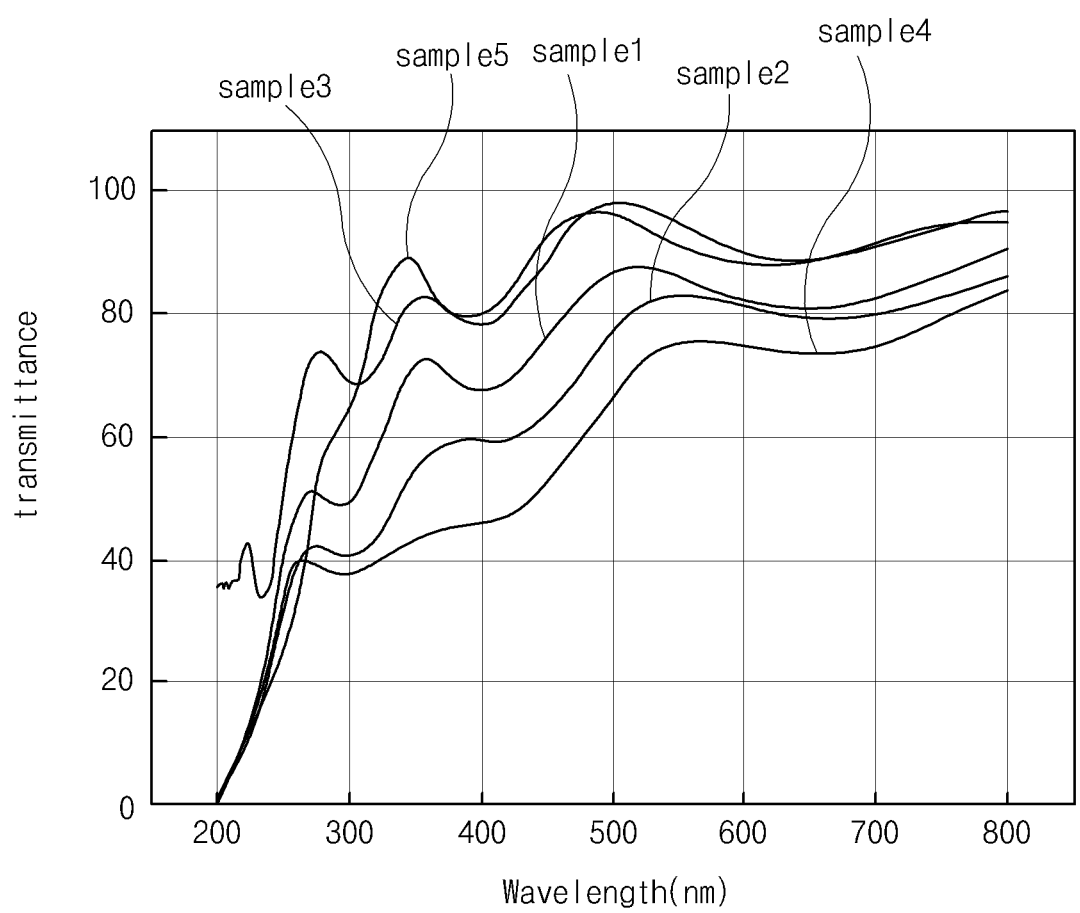
FIG. 4 is a graph illustrating transmittance of a transparent conductive material layer in a fabricating method according to the present invention.

FIG. 4 is a graph illustrating transmittance of a transparent conductive material layer in a fabricating method according to the present invention.

In FIG. 4, the "sample1" is a graph of a single transparent conductive material layer of about 500 angstroms thickness, and the "sample2" is a graph of a single transparent conducive material layer of about 500 angstroms thickness subjected to the plasma process. The "sample3" is a graph of a single transparent conductive material layer of about 500 angstroms subjected to the annealing process after the plasma process, and the "sample 4" is a graph of a double-layered structure of a first transparent conductive material layer of about 400 angstroms subjected to the plasma process and a second transparent conductive material layer of about 100 angstroms formed on the first conductive material layer. The "sample5" is a graph of a double-layered structure of a first transparent conductive material layer of about 400 angstroms subjected to the annealing process after the plasma process and a second transparent conductive material layer of about 100 angstroms formed on the first conductive material layer. The annealing process is performed under a temperature about 230° C. and for about 30 minutes in the "sample5".

As shown in FIG. 4, the transparent conductive material layer subjected to the plasma process in the "sample2" and the "sample4" has relatively low transmittance. Accordingly, when the plasma process is performed, it is understood that the problem resulting from the light reflected on the chuck is prevented.

The transparent conductive material layer subjected to the annealing process after the plasma process in the "sample3" and the "sample5" has higher transmittance than those in the "sample2" and the "sample4". Particularly, the transparent conductive material layer in the "sample3" and the "sample5" has higher transmittance than that in the "sample1".

In addition, since the "sample4" has lower transmittance than the "sample2", the problem resulting from the light reflected on the chuck is effectively prevented by forming the second transparent conductive material layer on the first transparent conductive material layer subjected to the plasma process.

Moreover, the "sample5" subjected to the annealing process has higher transmittance than the "sample3" subjected to the annealing process.

Accordingly, in the present invention, the problem resulting from the light reflected on the chuck is prevented, and the array substrate has substantially the same as or higher transmittance than the related art array substrate.

As mentioned above, in the array substrate of the embodiment of the present invention, by performing the plasma process on the first transparent conductive material layer and forming the second transparent conductive material layer on the first transparent conductive material layer, the problem resulting from the light reflected on the chuck is prevented. In addition, after pattering the first transparent conductive layer subjected to plasma process and the second transparent conductive layer formed on the first transparent conductive layer, the annealing process is performed such that the first transparent conductive layer subjected to plasma process regains the transparent property. As a result, the array substrate has improved transmittance.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of forming a transparent electrode, comprising:
    forming a first transparent conductive material layer on a base;
    performing a plasma process on the first transparent conductive material layer such that the upper portion of the first transparent conductive material layer is changed into semitransparent;
    forming a second transparent conductive material layer on the first transparent conductive material layer;
    patterning the second transparent conductive material layer and the first transparent conductive material layer; and
    annealing the patterned second transparent conductive material layer and the patterned first transparent conductive material layer such that the upper portion of the first transparent conductive material layer is changed into transparent.

2. The method according to claim 1, wherein the first transparent conductive material layer includes indium and oxygen.

3. The method according to claim 2, wherein the first transparent conductive material layer is formed of one of indium-tin-oxide, indium-zinc-oxide, indium-gallium-oxide and indium-tin-zinc-oxide.

4. The method according to claim 1, wherein the step of annealing is performed under a temperature of 200 to 300° C. for 30 to 300 minutes.

5. The method according to claim 1, wherein the step of performing the plasma process is performed by flowing a hydrogen gas at the rate of 80 to 100 standard cubic centimeter per minute (sccm) for 40 to 100 seconds.

6. The method according to claim 1, wherein the step of performing the plasma process is performed in a chamber having the degree of a vacuum of 80 to 120 mTorr.

7. The method according to claim 1, wherein the step of patterning the second transparent conductive material layer and the first transparent conductive material layer 210 includes:
    forming a photoresist layer on the second transparent conductive layer;
    exposing the photoresist layer using an exposing mask;
    developing the exposed photoresist layer to form a photoresist pattern;
    etching the second transparent conductive material layer and the first transparent conductive material layer using the photoresist pattern as an etching mask; and
    stripping the photoresist pattern to form a common electrode and a pixel electrode.

8. A method of fabricating an array substrate for a liquid crystal display device, comprising:
    forming a gate line on a substrate;
    forming a data line on the substrate, the data line crossing the gate line to define a pixel region;
    forming a thin film transistor connected to the gate line and data line in the pixel region;
    forming a first transparent conductive material layer on the substrate on which the gate line, the data line and the thin film transistor are formed;
    performing a plasma process to the first transparent conductive material layer with hydrogen gas such that the upper portion of the first transparent conductive material layer is changed into semitransparent;
    forming a second transparent conductive material layer on the first transparent conductive material layer;
    patterning the second transparent conductive material layer and the first transparent conductive material layer to form a pixel electrode connected to the thin film transistor in the pixel region; and
    annealing the pixel electrode such that the upper portion is changed into transparent.

9. The method according to claim 8, wherein the first transparent conductive material layer includes indium and oxygen.

10. The method according to claim 9, wherein the first transparent conductive material layer is formed of one of indium-tin-oxide (ITO), indium-zinc-oxide (IZO), indium-gallium-zinc-oxide (IGZO) and indium-tin-zinc-oxide (ITZO).

11. The method according to claim 8, wherein the upper semitransparent portion is changed into transparent by the step of annealing.

12. The method according to claim 8, wherein the step of annealing is performed under a temperature of 200 to 300° C. for 30 to 300 minutes.

13. The method according to claim 8, wherein the step of performing the plasma process is performed with a hydrogen gas flowing at a rate of 80 to 100 standard cubic centimeter per minute (sccm) for 40 to 100 seconds.

14. The method according to claim 8, wherein the step of performing the plasma process is performed in a chamber having the degree of a vacuum of 80 to 120 mTorr.

15. The method according to claim 8, wherein the step of patterning the second transparent conductive material layer and the first transparent conductive material layer includes:
    forming a photoresist layer on the second transparent conductive layer;
    exposing the photoresist layer using an exposing mask;
    developing the exposed photoresist layer to form a photoresist pattern;

etching the second transparent conductive material layer and the first transparent conductive material layer using the photoresist pattern as an etching mask; and stripping the photoresist pattern.

16. The method according to claim 8, wherein the step of forming the gate line also forms a common line, and wherein a common electrode in the pixel region is further formed in the step of patterning the second transparent conductive material layer and the first transparent conductive material layer, and wherein the common electrode is alternately arranged with the pixel electrode and connected to the common line.

17. The method according to claim 16, further comprising forming a passivation layer on the substrate, on which the thin film transistor and the common line are formed, the passivation layer including a first contact hole exposing a portion of the thin film transistor and a second contact hole exposing a portion of the common line, wherein the pixel electrode and the common electrode are disposed on the passivation layer and connected to the portion of the thin film transistor and the portion of the common line through the first contact hole and the second contact hole, respectively.

18. The method according to claim 8, further comprising forming a passivation layer on the substrate, on which the thin film transistor is formed, the passivation layer including a contact hole exposing a portion of the thin film transistor, wherein the pixel electrode is disposed on the passivation layer and connected to the portion of the thin film transistor through the contact hole.

\* \* \* \* \*